(12) United States Patent
Sumida et al.

(10) Patent No.: US 6,707,253 B2
(45) Date of Patent: Mar. 16, 2004

(54) MATCHING CIRCUIT AND PLASMA PROCESSING APPARATUS

(75) Inventors: Kenji Sumida, Osaka (JP); Tomohiro Okumura, Kadoma (JP); Yukihiro Maegawa, Ibaraki (JP); Ichiro Nakayama, Kadoma (JP); Kibatsu Shinohara, Yokohama (JP); Minoru Kanda, Yokohama (JP); Shiniti Matamura, Yokohama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/324,031

(22) Filed: Dec. 20, 2002

(65) Prior Publication Data

US 2003/0136519 A1 Jul. 24, 2003

(30) Foreign Application Priority Data

Dec. 25, 2001 (JP) ........................................ 2001-391875

(51) Int. Cl.[7] ................................................ H01J 23/36
(52) U.S. Cl. ................................ 315/39.53; 315/39.55; 315/111.51; 315/111.21; 118/723 I; 118/723 AN; 156/345.48
(58) Field of Search ........................ 315/111.21, 111.51, 315/39, 39.53, 39.55, 344, 267; 219/121.51, 121.55, 121.43; 118/723 R, 723 I, 723 IR, 723 AN; 156/345.41, 345.48

(56) References Cited

U.S. PATENT DOCUMENTS

| 5,070,277 A | * | 12/1991 | Lapatovich | .................. 315/245 |
| 6,072,147 A | * | 6/2000 | Koshiishi et al. | ...... 219/121.43 |
| 6,080,271 A | * | 6/2000 | Fujii | ..................... 156/345.48 |
| 6,353,206 B1 | * | 3/2002 | Roderick | ............... 219/121.52 |

* cited by examiner

Primary Examiner—Haissa Philogene
(74) Attorney, Agent, or Firm—Wenderoth, Lind & Ponack, L.L.P.

(57) ABSTRACT

The present invention provides a matching circuit which has a wide range in which matching can be achieved and the matched state of which is stabilized with respect to a change in the load state. To an input terminal (31) of a matching circuit (30), one terminal of a first variable reactance element (32) is connected. The other terminal of the first variable reactance element (32) is connected to a point between a first fixed reactance element (33a) and a second fixed reactance element (33b), which are connected in series. The first fixed reactance element (33a) is grounded, and the second fixed reactance element (33b) is connected to one terminal of a second variable reactance element (36) and connected to one terminal of a stripline (37). The other terminal of the second variable reactance element (36) is grounded, and the other terminal of the stripline (37) is connected to an output terminal (38).

10 Claims, 5 Drawing Sheets

MATCHING CIRCUIT AND PLASMA PROCESSING APPARATUS

BACKGROUND OF THE INVENTION

The present invention relates to a matching circuit and a plasma processing apparatus used for manufacturing electronic devices of semiconductors, liquid crystal devices and so on and micro machines.

In manufacturing electronic devices of semiconductors, liquid crystal devices and so on and micro machines, a thin film processing technology by plasma processing has been used. FIG. 4 shows a typical plasma processing apparatus. A gas supply system 2 is provided on the sidewall of a vacuum vessel 1. Air discharging is performed by a turbo-molecular pump 4 through an exhaust port 3 provided on a bottom wall while a prescribed gas is supplied to the inside by the gas supply system 2, and the vacuum vessel 1 is internally kept at a prescribed pressure. A pressure regulating valve 5 for controlling the inside of the vacuum vessel 1 to a prescribed pressure is provided above the exhaust port 3 so as to move up and down. A substrate electrode 7, on which a substrate 6 to be subjected to plasma processing is placed, is fixed via four props 8 inside the vacuum vessel 1. The substrate electrode 7 is supplied with a high-frequency power of a frequency of 500 kHz from a high frequency power source 9 for the substrate electrode. An inner chamber 10 is provided particularly around the substrate electrode 7 inside the vacuum vessel 1, so that the inner wall surface of the vacuum vessel 1 is prevented from becoming dirty due to the plasma processing.

Moreover, a disk-shaped antenna 11 is fixed on the inner surface of the upper wall of the vacuum vessel 1 via a dielectric plate 12 oppositely to the substrate electrode 7. The lower surface of the antenna 11 is covered with a cover 13. Around the antenna 11, a conductor ring 14 is fixed via a dielectric ring 15 on the inner surface of the upper wall of the vacuum vessel 1. With this arrangement, an annular plasma trap 16 is provided between the conductor ring 14 and the antenna 11 and between the dielectric ring 15 and the dielectric plate 12. The antenna 11 is provided with a feeder rod 17 that penetrates through the dielectric plate 12 and the upper wall of the vacuum vessel 1, and the feeder rod 17 is supplied with a high-frequency power of a frequency f=100 MHz from a high-frequency power source 18 for the antenna via a matching circuit 20 by way of a coaxial pipe 19.

If the substrate electrode 7 and the antenna 11 are supplied with the high-frequency power in a state that the vacuum vessel 1 is internally discharged and filled with a prescribed gas at a prescribed pressure, then plasma is generated in the vacuum vessel 1, causing the substrate 6 placed on the substrate electrode 7 to be subjected to plasma processing.

The matching circuit 20 is to reduce the power loss by matching the impedance of the antenna 11 with the characteristic impedance of the coaxial pipe 19 that serves as a coaxial line. The matching circuit 20 is constructed of the circuit shown in FIG. 5. That is, to an input terminal 21 to which the coaxial pipe 19 is connected, one terminal of a first variable capacitor 22 that serves as a first variable reactance element is connected via a copper plate 23 that acts as inductance. The other terminal of the first variable capacitor 22 is grounded via a casing 24. One terminal of a second variable capacitor 25 that serves as a second variable reactance element is connected to the input terminal 21 via a copper plate 26 that acts as inductance. The other terminal of the second variable capacitor 25 is connected to an output terminal 27 of the matching circuit 20 to which the antenna 11 is connected.

However, the matching circuit 20 of the conventional plasma processing apparatus has had a narrow range in which matching can be achieved. Thus, the matching circuit 20 has been able to secure the matching only on limited discharge conditions even when the discharge conditions of the type and flow rate of gas, the pressure in the vacuum vessel, the high-frequency power and so on have been changed. Moreover, if any of the gas type, the gas flow rate, the pressure in the vacuum vessel and the high-frequency power is changed during the plasma processing, then it sometimes takes about five to ten seconds to the attainment of a matched state when the change in the impedance of the antenna 11 before and after the change is large. If the change in the impedance of the antenna 11 is too large, the matched state has sometimes been unable to be secured. Furthermore, if the frequency of the high-frequency power applied to the antenna 11 is increased, then an excessive current flows through the first variable reactance element 22 and the second variable reactance element 25 of the matching circuit 20, and an overvoltage is generated across the terminals particularly of the second variable reactance element 25. This has consequently led to a problem that the temperature has locally risen and the matching state has become unstable.

SUMMARY OF THE INVENTION

The present invention has been accomplished in view of the aforementioned problems and has the object of providing a matching circuit and a plasma processing apparatus, which have a wide range in which matching can be achieved and the matched state of which is stable with respect to a change in the load state.

As a means for solving the aforementioned problems, the present invention provides a matching circuit comprising:

an input terminal;

an output terminal;

a first fixed reactance element;

a second fixed reactance element connected in series to the first fixed reactance element the other terminal of which is grounded;

a first variable reactance element one terminal of which is connected to the input terminal and the other terminal of which is connected to a point between the first fixed reactance element and the second fixed reactance element;

a second variable reactance element one terminal of which is connected to the second fixed reactance element and the other terminal of which is grounded; and a stripline one terminal of which is connected both to the second variable reactance element and the second fixed reactance element and the other terminal of which is connected to the output terminal.

Assuming that a high-frequency power applied to the input terminal has a wavelength of $\lambda$ (m), then a sum total D1+D2 of a length D1 (m) from the output terminal to an antenna connected to the output terminal and a length D2 (m) of the stripline should preferably satisfy the expression of:

$$\lambda/32 + \lambda/2 \times (n-1) \leq D1+D2 \leq -\lambda/32 + \lambda/2 \times n \quad (n=1, 2, 3, \ldots)$$

It is more preferable that the length D1+D2 satisfies the expression of:

$$\lambda/16 \leq D1+D2 \leq 4\lambda/16.$$

The first variable reactance element and the second variable reactance element can each be a variable capacitor. It is preferable that each of the first fixed reactance element and the second fixed reactance element is a coil and the elements are connected in series to constitute one fixed coil. The first fixed reactance element and the second fixed reactance element can each be replaced by a variable reactance element.

As a means for solving the aforementioned problems, the present invention provides a plasma processing apparatus including a vacuum vessel; a gas supply system for supplying a gas into the vacuum vessel; an exhaust system for evacuating the inside of the vacuum vessel; a substrate electrode, which is provided inside the vacuum vessel and on which a substrate to be processed is placed; a substrate electrode high-frequency power source for supplying a high-frequency power to the substrate electrode; an antenna arranged oppositely to the substrate electrode; an antenna high-frequency power source for supplying a high-frequency power to the antenna; and a matching circuit arranged between the antenna and the antenna high-frequency power source, the matching circuit comprising:

an input terminal;

an output terminal;

a first fixed reactance element;

a second fixed reactance element connected in series to the first fixed reactance element the other terminal of which is grounded;

a first variable reactance element one terminal of which is connected to the input terminal and the other terminal of which is connected to a point between the first fixed reactance element and the second fixed reactance element;

a second variable reactance element one terminal of which is connected to the second fixed reactance element and the other terminal of which is grounded; and a stripline one terminal of which is connected both to the second variable reactance element and the second fixed reactance element and the other terminal of which is connected to the output terminal.

BRIEF DESCRIPTION OF THE DRAWINGS

Other objects and features of the present invention will become clear from the following detail description with reference to the accompanying drawings in which.

DETAILED DESCRIPTION OF THE PREFERRED EMBODIMENT

An embodiment of the present invention will be described below with reference to the accompanying drawings.

Figure 1:
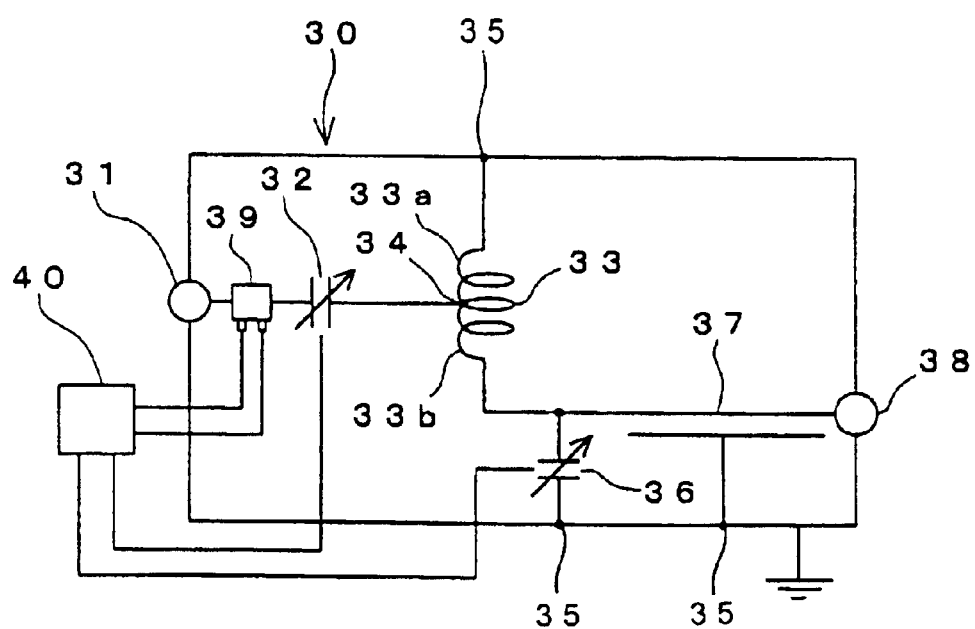
FIG. 1 is a circuit diagram of a matching circuit according to the present invention.
Figure 4:
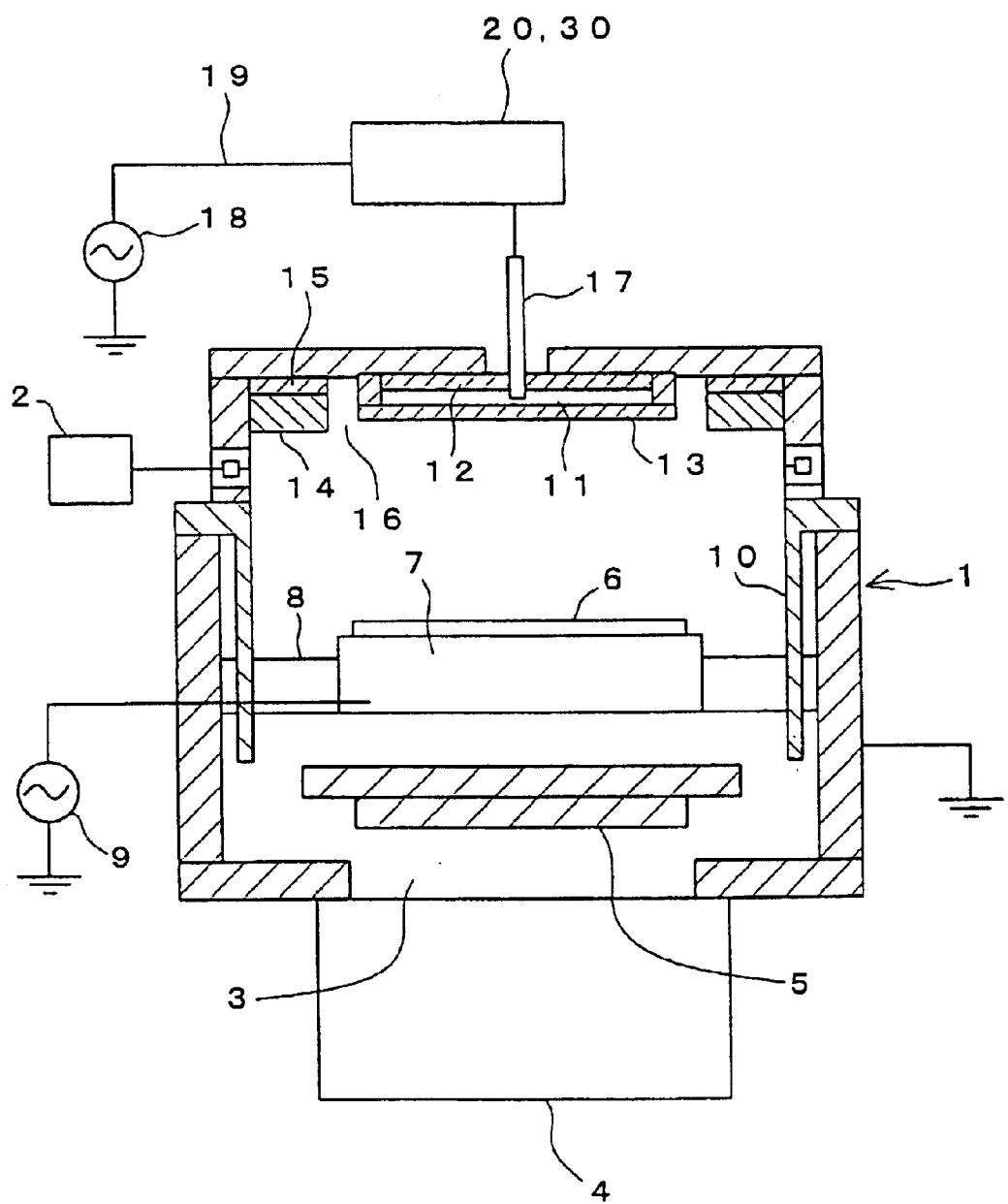
FIG. 4 is a schematic view of a plasma processing circuit.
Figure 5:
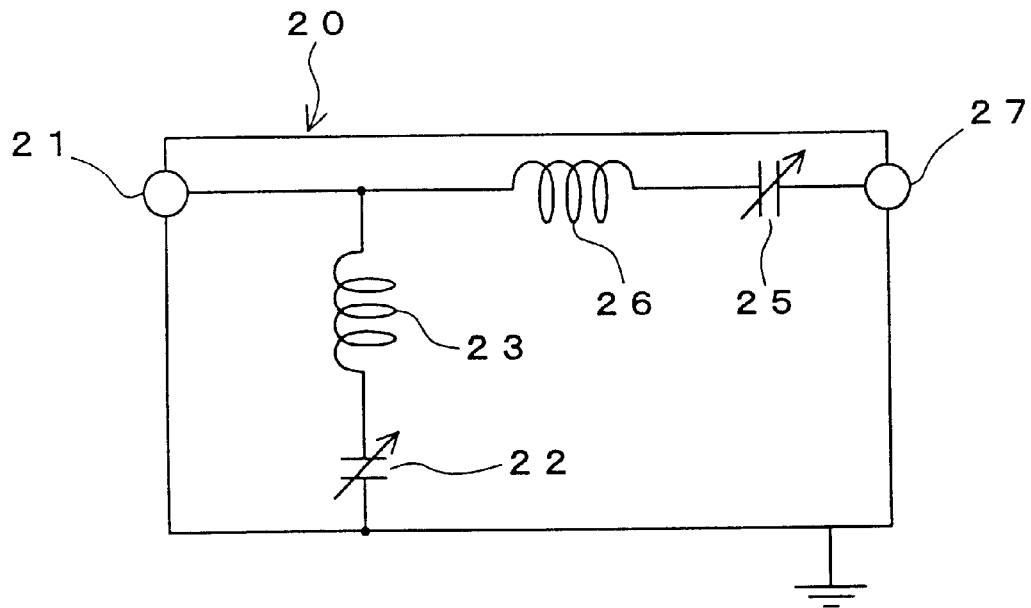
FIG. 5 is a circuit diagram of a conventional matching circuit.

FIG. 1 shows a matching circuit 30 according to the present invention. A plasma processing apparatus that employs this matching circuit 30 is the same as the typical plasma processing apparatus shown in FIG. 4, and therefore, neither description nor illustration is provided therefor.

Figure 2:
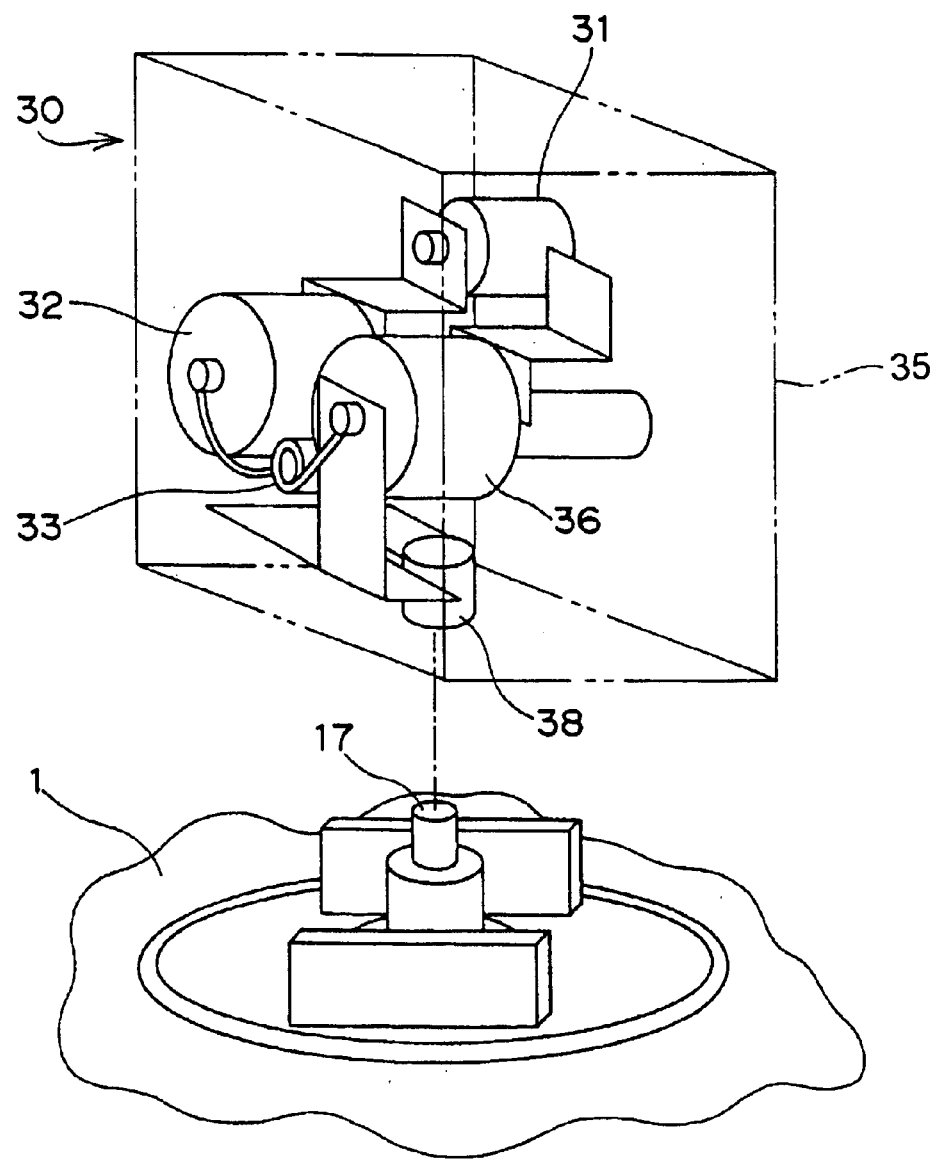
FIG. 2 is a stereographic perspective view showing the arrangement of the components of the matching circuit of FIG. 1.

This matching circuit 30 is to match the impedance of an antenna 11 of the plasma processing apparatus with the characteristic impedance of the coaxial pipe 19 and the high-frequency power source 18 for the antenna. To an input terminal 31 to which the coaxial pipe 19 from the antenna high-frequency power source 18 is connected, one terminal of a first variable capacitor 32 that serves as a first variable reactance element is connected. The other terminal of the first variable capacitor 32 is connected to a tap 34 of a fixed coil 33. The fixed coil 33 is constructed of a first fixed reactance element 33a and a second fixed reactance element 33b which are bounded by the tap 34. The tap 34 of the fixed coil 33 is adjusted in a proper position so that an input impedance viewed from the input terminal 31 of the matching circuit 30 becomes 50 Ω. One terminal of the fixed coil 33 located on the first fixed reactance element 33a side is connected to a casing 35 so as to be grounded. The other terminal located on the second fixed reactance 33b side is connected to one terminal of a second variable capacitor 36 that serves as a second variable reactance element and connected to one terminal of a stripline 37. The other terminal of the second variable capacitor 36 is connected to the casing 35 so as to be grounded. The other terminal of the stripline 37 is connected to an output terminal 38 of the matching circuit 30 to be connected to the antenna 11. The stripline 37 is arranged along the casing 35 and forms a parallel plate with the casing 35. FIG. 2 stereographically shows this matching circuit 30.

A detector 39 for detecting high-frequency progressive wave and reflected wave from the antenna high-frequency power source 18 is provided between the input terminal 31 and the first variable capacitor 32. The high-frequency progressive wave and reflected wave detected by the detector 39 are inputted to a controller 40. The controller 40 controls the first variable capacitor 32 and the second variable capacitor 36 so that the high-frequency reflected wave detected by the detector 39 become zero.

In the present embodiment, the capacitance C1 of the first variable capacitor 32 is 10 to 60 pF, the capacitance C2 of the second variable capacitor 36 is 10 to 609 pF, the inductance L of the fixed coil 33 is 1.3 $\mu$H, the length D2 of the stripline 37 is 320 mm, the length D1 from the output terminal 38 of the matching circuit 30 to the antenna 11 is 118 mm, and the sum total D=D1+D2 of the length D1 from the output terminal 38 of the matching circuit 30 to the antenna 11 and the length D2 of the stripline 37 is 438 mm.

Figure 3:
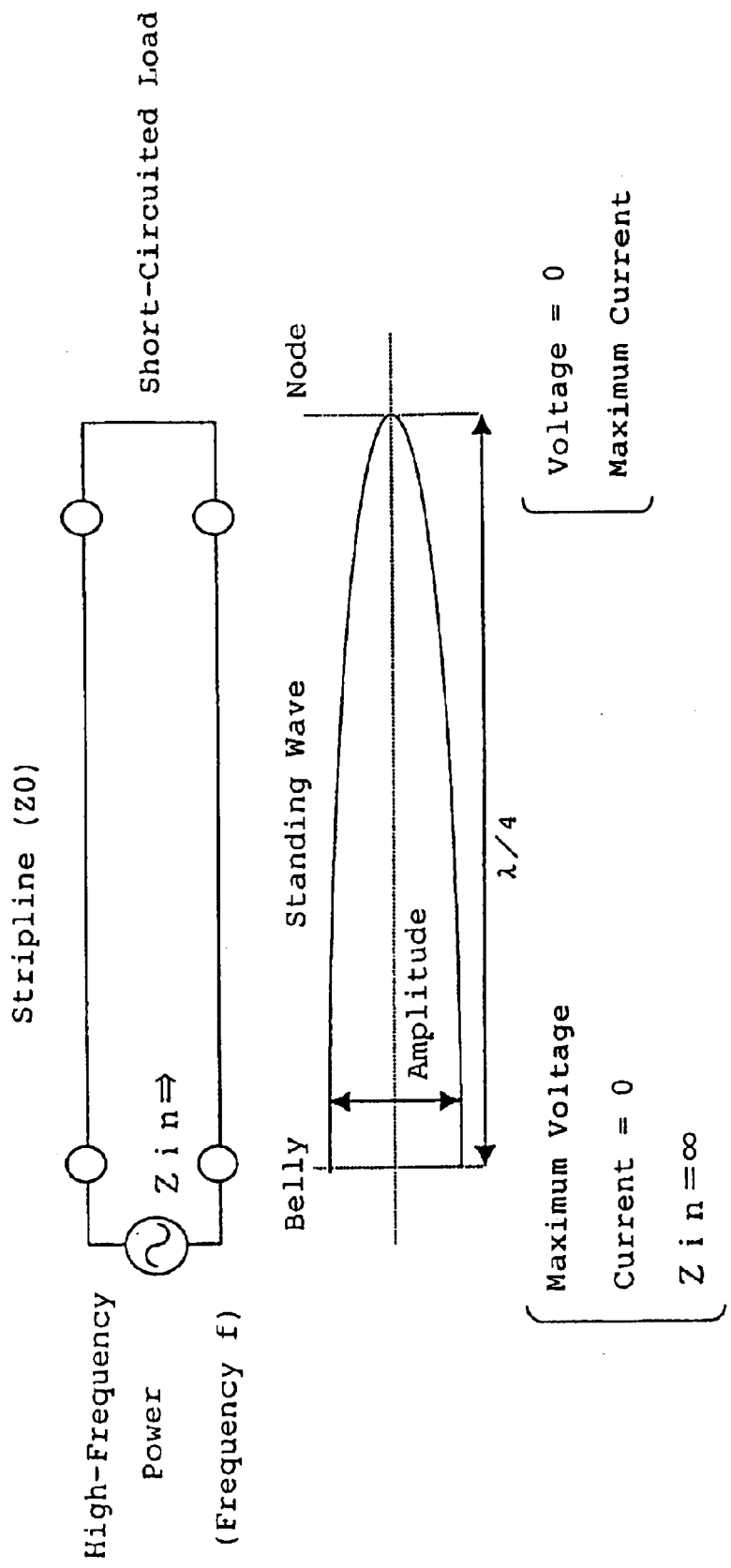
FIG. 3 is a view showing the state of the standing wave exerted on the load.

The impedance of plasma viewed from the matching circuit 30 is not greater than about 5 Ω, and it is about 1 Ω in the present embodiment, providing an almost short-circuited state at the load end. When high frequency is applied to the short-circuited end via the stripline 37 of a characteristic impedance Z0, then a standing wave having a node at the short circuit point is generated as shown in FIG. 3. At this time, impedance Zin on the load side viewed from a point located $\lambda/4$ apart from the load end becomes infinite. Therefore, when a high-frequency power is applied from the point located $\lambda/4$ apart from the load end, then a current is maximized at the load end, and the current is minimized at the end of power application.

However, if the impedance Zin is infinite, then the impedance matching with the high-frequency power source 18 cannot be achieved. Accordingly, the components of the matching circuit 30 except for the stripline 37 are arranged apart from the load end by a length expressed by the following expression. That is, the sum total D=D1+D2 of the length D1 from the output terminal 38 of the matching circuit 30 to the antenna 11 and the length D2 of the stripline 37 is set within the range of the following expression:

$$\lambda/32+\lambda/2\times(n-1) \leq D1+D2 \leq -\lambda/32+\lambda/2\times n \ (n=1, 2, 3, \ldots)$$

The preferable range of the length D1+D2 is expressed by the following expression:

$$\lambda/16 \leq D1+D2 \leq 4\lambda/16.$$

As described hereinabove, by providing the stripline 37 and setting the length D1+D2 within the aforementioned range, the current flowing through the second variable reactance 36 is reduced, and the local temperature rise can be restrained. Then, the load impedance viewed from the matching circuit 30 is dominated by the length of the stripline 37 and is not influenced by the impedance change of the antenna 11 when the discharge conditions of the gas type, the gas flow rate, the pressure, the high-frequency power and so on are changed. Consequently, the range in which matching can be achieved is widened, and the matched state is stabilized.

The shape of the vacuum vessel 1 and the shape of the antenna 11 in the aforementioned embodiment are each illustrated as a mere example, and it is needless to say that these shapes of the present invention can be changed and modified in various ways.

In the aforementioned embodiment, the frequency of the high-frequency power applied to the antenna 11 is set at 100 MHz. However, the frequency, at which the stripline 37 in the matching circuit 30 effectively operates, is not lower than about 50 MHz. Therefore, the frequency of the high-frequency power applied to the antenna 11 of the present invention is required to be not lower than 50 MHz.

Although the variable capacitors 32 and 36 are employed as the first variable reactance element and the second variable reactance element in the aforementioned embodiment, it is acceptable to employ another variable element of, for example, a variable inductor. Although the first fixed reactance element and the second fixed reactance element are provided by one fixed coil 33, they may be provided by separate elements. Furthermore, the first fixed reactance element and the second fixed reactance element may each be provided by a variable inductor or a variable capacitor instead of the fixed elements.

It is to be noted that the present invention is also effective in the case where a coil for an inductive coupling plasma source and an electromagnetic radiation antenna for a surface wave plasma source.

As is apparent from the above, according to the present invention, by setting the sum total D1+D2 of the length D1 from the output terminal of the matching circuit to the antenna and the length D2 of the stripline within the aforementioned range, the current flowing through the second variable reactance is reduced, and the local temperature rise can be restrained. Then, the load impedance viewed from the matching circuit is dominated by the length of the stripline and is not influenced by the impedance change of the antenna when the discharge conditions of the gas type, the gas flow rate, the pressure, the high-frequency power and so on are changed. Consequently, the range in which matching can be achieved is widened, and the matched state is stabilized.

Although the present invention has been fully described by way of the examples with reference to the accompanying drawing, it is to be noted that various changes and modifications will be apparent to those skilled in the art. Therefore, unless such changes and modifications otherwise depart from the spirit and scope of the present invention, they should be construed as being included therein.

What is claimed is:

1. A matching circuit comprising:
   an input terminal;
   an output terminal;
   a first fixed reactance element;
   a second fixed reactance element connected in series to the first fixed reactance element the other terminal of which is grounded;
   a first variable reactance element one terminal of which is connected to the input terminal and the other terminal of which is connected to a point between the first fixed reactance element and the second fixed reactance element;
   a second variable reactance element one terminal of which is connected to the second fixed reactance element and the other terminal of which is grounded; and
   a stripline one terminal of which is connected both to the second variable reactance element and the second fixed reactance element and the other terminal of which is connected to the output terminal.

2. The matching circuit as claimed in claim 1, wherein, assuming that a high-frequency power applied to the input terminal has a wavelength of $\lambda$ (m), then a sum total D1+D2 of a length D1 (m) from the output terminal to an antenna connected to the output terminal and a length D2 (m) of the stripline satisfies the expression of:

$$\lambda/32+\lambda/2\times(n-1) \leq D1+D2 \leq -\lambda/32+\lambda/2\times n \ (n=1, 2, 3, \ldots).$$

3. The matching circuit as claimed in claim 2, wherein the length D1+D2 satisfies the expression of:

$$\lambda/16 \leq D1+D2 \leq 4\lambda/16.$$

4. The matching circuit as claimed in claim 1, wherein the first variable reactance element is a variable capacitor.

5. The matching circuit as claimed in claim 1, wherein the second variable reactance element is a variable capacitor.

6. The matching circuit as claimed in claim 1, wherein each of the first fixed reactance element and the second fixed reactance element is a coil, and the elements are connected in series to constitute one fixed coil.

7. The matching circuit as claimed in claim 1, wherein the first fixed reactance element is replaced by a variable reactance element.

8. The matching circuit as claimed in claim 1, wherein the second fixed reactance element is replaced by a variable reactance element.

9. A plasma processing apparatus comprising a vacuum vessel; a gas supply system for supplying a gas into the vacuum vessel; an exhaust system for evacuating the inside of the vacuum vessel; a substrate electrode, which is provided inside the vacuum vessel and on which a substrate to be processed is placed; a substrate electrode high-frequency power source for supplying a high-frequency power to the substrate electrode; an antenna arranged oppositely to the substrate electrode; an antenna high-frequency power source for supplying a high-frequency power to the antenna; and a matching circuit arranged between the antenna and the antenna high-frequency power source, the matching circuit comprising:
   an input terminal;
   an output terminal;

a first fixed reactance element;

a second fixed reactance element connected in series to the first fixed reactance element the other terminal of which is grounded;

a first variable reactance element one terminal of which is connected to the input terminal and the other terminal of which is connected to a point between the first fixed reactance element and the second fixed reactance element;

a second variable reactance element one terminal of which is connected to the second fixed reactance element and the other terminal of which is grounded; and a stripline one terminal of which is connected both to the second variable reactance element and the second fixed reactance element and the other terminal of which is connected to the output terminal.

10. The plasma processing apparatus as claimed in claim 9, wherein, assuming that a high-frequency power applied to the input terminal has a wavelength of $\lambda$ (m), then a sum total D1+D2 of a length D1 (m) from the output terminal to an antenna connected to the output terminal and a length D2 (m) of the stripline satisfies the expression of:

$$\lambda/32+\lambda/2\times(n-1) \leq D1+D2 \leq -\lambda/32+\lambda/2\times n (n\ 1, 2, 3, \ldots).$$

* * * * *